United States Patent
Yamakawa et al.

(10) Patent No.: US 6,812,868 B2
(45) Date of Patent: Nov. 2, 2004

(54) RUN LENGTH LIMITED CODE GENERATION METHOD, RUN LENGTH LIMITED CODE RECORDING/ REPRODUCING APPARATUS, AND RUN LENGTH LIMITED CODE RECORDING/ REPRODUCTION METHOD

(75) Inventors: Hideyuki Yamakawa, Kawasaki (JP); Akihito Ogawa, Yokohama (JP); Yutaka Kashihara, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/615,804

(22) Filed: Jul. 10, 2003

(65) Prior Publication Data

US 2004/0021590 A1 Feb. 5, 2004

(30) Foreign Application Priority Data

Jul. 31, 2002 (JP) .................................... 2002-223521

(51) Int. Cl.[7] .............................................. H03M 7/00
(52) U.S. Cl. ........................................... 341/59; 341/58
(58) Field of Search ................................ 341/50, 59, 58

(56) References Cited

U.S. PATENT DOCUMENTS

| 4,804,959 A | * | 2/1989 | Makansi et al. ............... 341/59 |
| 5,432,799 A | * | 7/1995 | Shimpuku et al. ........... 714/769 |
| 5,696,505 A | | 12/1997 | Immink ........................ 341/59 |
| 6,157,325 A | * | 12/2000 | Kahlman et al. .............. 341/59 |
| 6,188,336 B1 | * | 2/2001 | Kim ............................. 341/59 |

FOREIGN PATENT DOCUMENTS

| JP | 9-17130 | 1/1997 |
| JP | 2002-15479 | 1/2002 |

* cited by examiner

*Primary Examiner*—Peguy JeanPierre
(74) *Attorney, Agent, or Firm*—Pillsbury Winthrop LLP

(57) ABSTRACT

A run length limited code recording/reproduction apparatus according to an aspect of this invention includes a generation unit for generating a plurality of different code sequences which have recording densities that gradually become higher, and a recording unit for recording the plurality of different code sequences generated by the generation unit on a plurality of successive subfields in a test data field of an information storage medium.

13 Claims, 6 Drawing Sheets

RUN LENGTH LIMITED CODE GENERATION METHOD, RUN LENGTH LIMITED CODE RECORDING/ REPRODUCING APPARATUS, AND RUN LENGTH LIMITED CODE RECORDING/ REPRODUCTION METHOD

CROSS-REFERENCE TO RELATED APPLICATIONS

This application is based upon and claims the benefit of priority from the prior Japanese Patent Application No. 2002-223521, filed Jul. 31, 2002, the entire contents of which are incorporated herein by reference.

BACKGROUND OF THE INVENTION

1. Field of the Invention

The present invention relates to a run length limited code generation method for generating a code used to adjust a reproduction circuit, which reproduces digital data from an information storage medium. The present invention also relates to a run length limited code recording/reproduction apparatus, which generates a code used to adjust a reproduction circuit, which reproduces digital data from an information storage medium, and records/reproduces that code on/from an information storage medium. Furthermore, the present invention relates to a run length limited code recording/reproduction method for generating a code used to adjust a reproduction circuit, which reproduces digital data from an information storage medium, and recording/reproducing that code on/from an information storage medium.

2. Description of the Related Art

As recording media that can store digital data, optical disks represented by DVDs are known. DVD-RAM (a type of DVD) comprises a signal recording layer. When this recording layer is irradiated with a laser beam of an appropriate energy, its crystalline state changes. Digital data can be recorded on the recording layer by exploiting such characteristics, i.e., a change in crystalline state. When the recording layer is irradiated with a laser light of appropriate energy, reflected light is obtained in a quantity corresponding to the crystalline state of the recording layer. By detecting this reflected light, digital data recorded on the recording layer can be reproduced.

In recent years, a PRML (Partial Response and Maximum Likelihood) technique is adopted to improve the recording density. A reference such as Jpn. Pat. Appln. KOKAI Publication No. 9-17130 or the like discloses the technical contents of the PRML technique. The technical contents of that technique will be briefly explained below for the purpose of ease of understanding.

Partial Response (PR) is a method of reproducing data while compressing a required signal band by positively utilizing intersymbol interference (interference between reproduction signals corresponding to bits which are recorded at neighboring positions). PR can be further categorized into a plurality of different classes depending on the way intersymbol interference is produced at that time. For example, in case of class 1, recorded data "1" is reproduced as 2-bit reproduction data "11", and intersymbol interference is produced for the subsequent 1 bit. A Viterbi decoding method (ML) is a kind of so-called maximum likelihood sequence estimation method, and reproduces data on the basis of information of signal amplitudes a plurality of times by effectively using the intersymbol interference rules of a reproduction waveform. For this process, synchronous clocks, which are synchronized with a reproduction waveform obtained from a recording medium, are generated, and the reproduction waveform itself is sampled using the clocks to be converted into amplitude information. After that, the amplitude information undergoes appropriate waveform equalization to be converted into a predetermined PR response waveform, and a Viterbi decoder outputs a maximum likely data sequence as reproduction data using old and current sample data. A combination of the aforementioned PR method and Viterbi decoding method (most likelihood decoding) is called a PRML method. In order to put this PRML technique into practice, a high-precision adaptive equalization technique that obtains a reproduction signal as a response of a target PR class, and a high-precision clock reproduction technique that supports the former technique are required.

A run length limited code used in the PRML technique will be explained below. A PRML reproduction circuit generates clocks synchronized with a signal itself reproduced from a recording medium from that signal. In order to generate stable clocks, the polarity of a recorded signal must be inverted within a predetermined period of time. At the same time, the polarity of the recorded signal must be inhibited from being inverted during the predetermined period of time, so as to reduce the maximum frequency of the recorded signal. A maximum data length free from inversion of the polarity of the recorded signal is called a maximum run length, and a minimum data length free from inversion of the polarity is called a minimum run length. A modulation rule which has a maximum run length of 8 bits and a minimum run length of 2 bits is called (1, 7)RLL, and a modulation rule which has a maximum run length of 8 bits and a minimum run length of 3 bits is called (2, 7)RLL. That is, a run length limited code sequence in which the minimum run length of identical codes is (d+1) and the maximum run length of identical codes is (k+1) is called a (d, k) run length limited code sequence. As a typical modulation/demodulation method used in an optical disk, (1, 7)RLL and EFM Plus (U.S. Pat. No. 5,696,505) are known.

In general, upon recording data on an optical disk, test data is recorded/reproduced on/from a dedicated recording calibration area to adjust a recording laser power and recording pulse shape. Even when data reproduction alone is made, test data is temporarily recorded on a dedicated area as in data recording, so as to determine the equalization characteristics of a reproduction circuit compatible to a recording medium at that time, and optimal equalization characteristics are obtained by adaptive learning while reproducing the recorded signal.

As a test data (test write) pattern used in this case, a technique described in Jpn. Pat. Appln. KOKAI Publication No. 2002-15479 is known. With this test pattern, runs of 2T, 2T, 4T, i.e., runs of a [ . . . 0011000011001111 . . . ] pattern are recorded on a test data area. By reproducing this signal, the recording power is adjusted and the comparison level for Viterbi decoding is adjusted at the same time. In this manner, the recording power and Viterbi decoder can be adjusted appropriately.

Upon making modulation based on (1, 7)RLL, the recorded mark length falls within the range from 2T to 8T. However, since the test data pattern disclosed in Jpn. Pat. Appln. KOKAI Publication No. 2002-15479 above uses a test pattern of 2T, 2T, 4T, the rate of patterns with short recorded mark lengths (many high-frequency components) is high. High-frequency components contained in a reproduction signal are attenuated considerably as the recording density improves. For this reason, when adaptive learning of a waveform equalizer is insufficient, it becomes difficult to obtain stable, high-precision reproduction clocks. Consequently, since clocks are unstable, adaptive learning does not function well. If optimal waveform equalization conditions are known, no problems are posed. However, in an optical disk that can exchange recording media, adaptive learning must start from non-optimal equalization conditions.

BRIEF SUMMARY OF THE INVENTION

A run length limited code generation method according to an embodiment of the present invention comprises: generating a plurality of different code sequences, which have recording densities that gradually become higher, as a plurality of different code sequences which are to be recorded on a plurality of successive subfields on a test data field of an information storage medium.

A run length limited code recording/reproduction apparatus according to an embodiment of the present invention comprises: a generation unit for generating a plurality of different code sequences which have recording densities that gradually become higher; and a recording unit for recording the plurality of different code sequences generated by the generation unit on a plurality of successive subfields in a test data field of an information storage medium.

A run length limited code recording/reproduction method according to an embodiment of the present invention comprises: generating a plurality of different code sequences which have recording densities that gradually become higher; and recording the plurality of generated different code sequences on a plurality of successive subfields in a test data field of an information storage medium.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below serve to explain the principles of the invention.

DETAILED DESCRIPTION OF THE INVENTION

An embodiment of the present invention will be described hereinafter with reference to the accompanying drawings.

Figure 1:
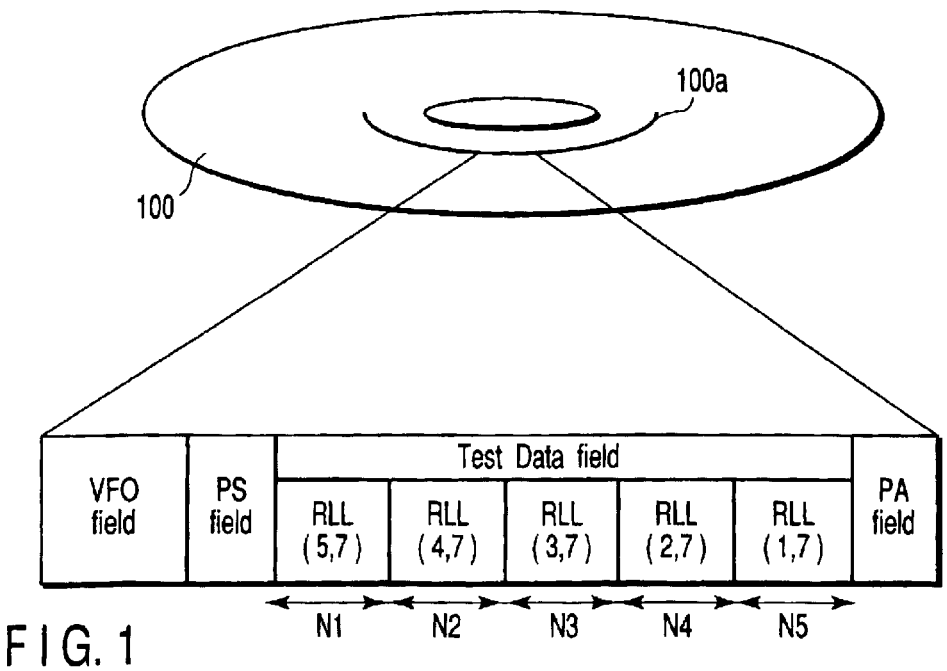
FIG. 1 is a schematic view showing the format of a test data sector on an information storage medium and the first example of a test pattern.

FIG. 1 shows a schematic format of a test data sector on an information storage medium. FIG. 1 expresses a test pattern generated by changing a run length limitation. That is, FIG. 1 shows a plurality of different code sequences generated based on a plurality of different run length limitations that gradually decrease a minimum run length of identical codes. In other words, FIG. 1 shows a plurality of different code sequences, the recording density of which increases gradually. This test data sector records run length limited codes, which are generated by a run length limited code generation method, run length limited code recording/reproduction apparatus, and run length limited code recording/reproduction method according to an embodiment of the present invention.

An information storage medium, i.e., an optical disk 100, is a medium on/from which digital data can be recorded/reproduced. The optical disk 100 has concentric or spiral recording tracks, and data is recorded/reproduced along the recording tracks. A part of a recordable area is assured as a test data area 100a in advance. On the recording tracks, data is recorded/reproduced using recorded data units called sectors. FIG. 1 shows a test data sector structure, and each sector is made up of a VFO field, PS field, test data field, and PA field. A plurality of such test data sectors are recorded on the test data area 100a. Also, a normal data recording area undergoes recording/reproduction based on the (1, 7)RLL rule.

Details of the test data sector in FIG. 1 will be explained below. The VFO field is used to adjust the frequency and phase of a PLL block of a data reproduction circuit. This field stores a recording pattern of a single frequency, e.g., runs of 3T, 3T, i.e., a data pattern ' . . . 000111000111 . . . '. The PS field stores a signal indicating the end of the VFO field, i.e., a data pattern which is not present in the next test data field, e.g., a data pattern '0111 1001 1110 0000 1110 0000 1111 0001 1000'.

The test data field is used for adaptive learning of the reproduction circuit, and adjustment of a recording control table. The test data field includes a plurality of subfields. The first subfield of the test data field records an N1-bit random pattern whose run length limitation is (5, 7)RLL. The second subfield of the test data field records an N2-bit random pattern whose run length limitation is (4, 7)RLL. The third subfield of the test data field records an N3-bit random pattern whose run length limitation is (3, 7)RLL. The fourth subfield of the test data field records an N4-bit random pattern whose run length limitation is (2, 7)RLL. Finally, the fifth subfield of the test data field records an N5-bit random pattern whose run length limitation is (1, 7)RLL. This fifth subfield of the test data field uses the same modulation rule as that of a random pattern of normal data. The PA field stores data indicating the end of the test data field. This PA field must be changed as needed to meet a run length limitation at a connection part with the final data in the immediately preceding test data field. The test pattern shown in FIG. 1 is recorded on the test data area 100a of the optical disk 100, and is reproduced from the test data area 100a. Based on the reproduction result, the waveform equalization characteristics of the reproduction circuit are adjusted.

The PA field stores data indicating the end of the test data field, e.g., a data pattern '011100110000'. This PA field must be changed as needed to meet a run length limitation at a connection part with the final data in the immediately preceding test data field.

Figure 5:
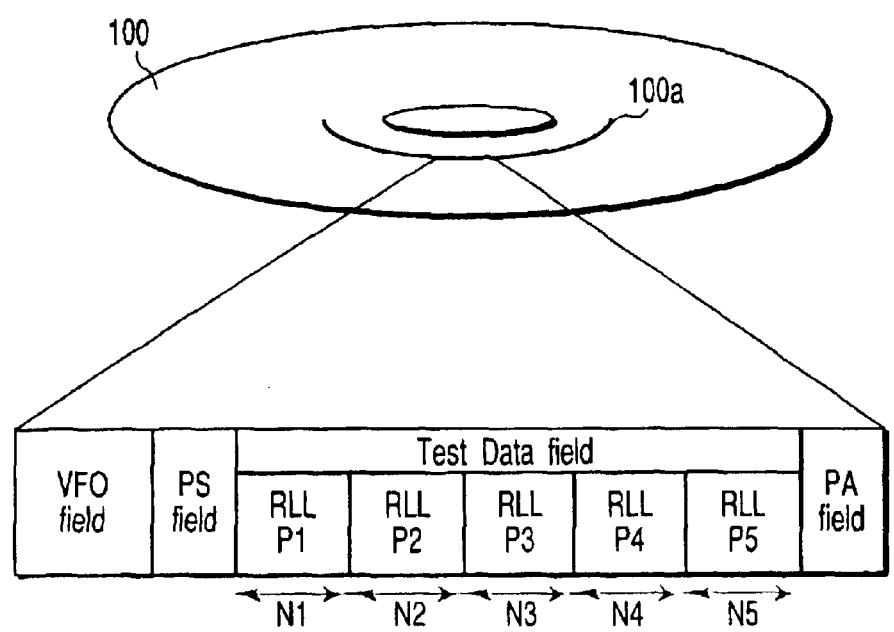
FIG. 5 is a schematic view showing the format of a test data sector on an information storage medium and the second example of a test pattern.

FIG. 5 shows a schematic format a test data sector on an information storage medium as in FIG. 1. FIG. 5 expresses a test pattern generated by changing the frequency of occurrence of a minimum run length pattern. That is, FIG. 5 shows a plurality of different code sequences, the frequency of occurrence of a minimum run length pattern of which gradually increases. In other words, FIG. 5 shows a plurality of different code sequences, the recording density of which increases gradually. Details of the test pattern shown in FIG. 5 will be explained later.

Figure 2:
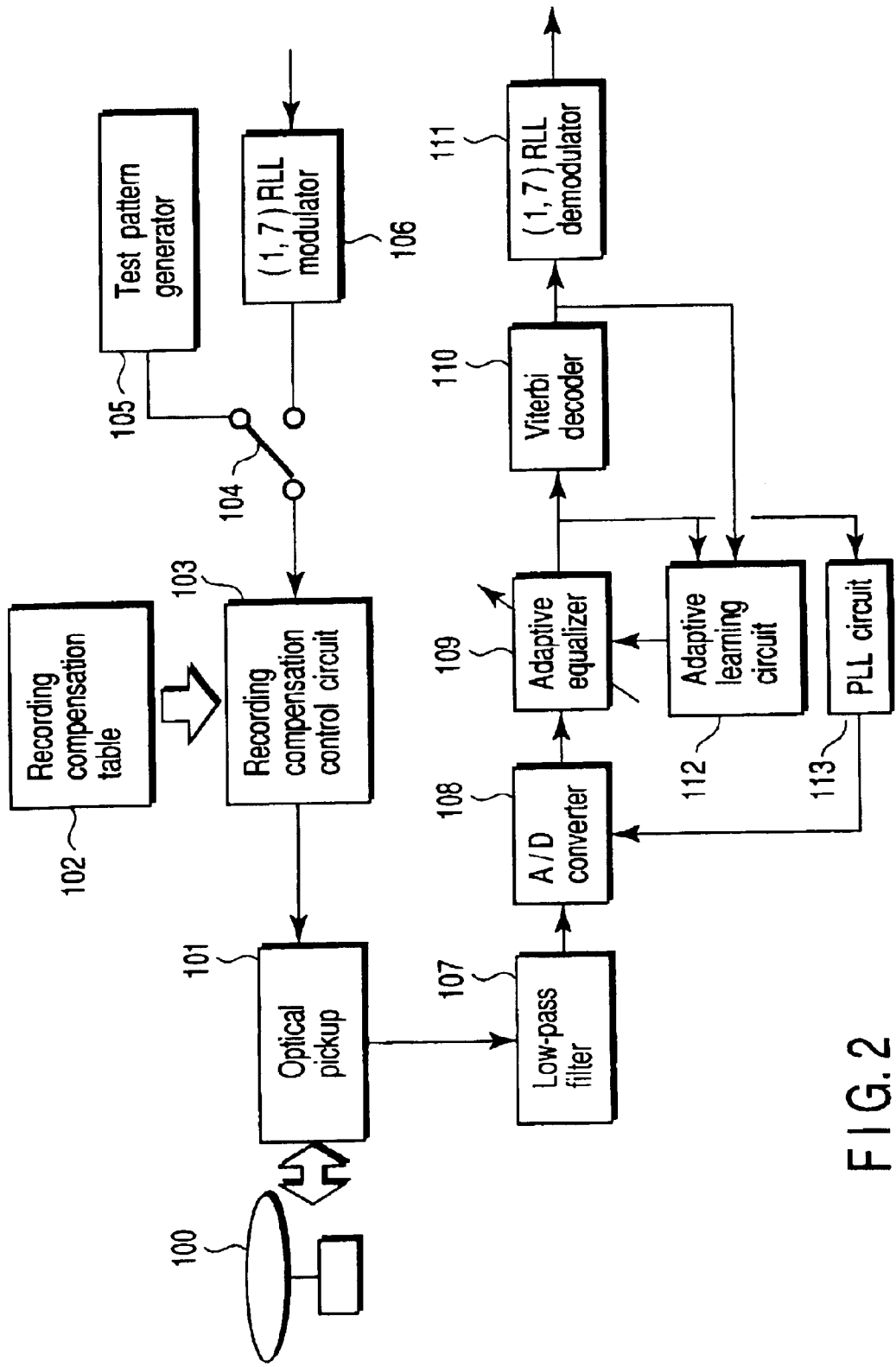
FIG. 2 is a schematic block diagram showing the arrangement of a recording/reproduction apparatus according to an embodiment of the present invention.

FIG. 2 is a schematic block diagram showing the arrangement of a recording/reproduction apparatus according to an embodiment of the present invention. As shown in FIG. 2, the recording/reproduction apparatus (run length limited code recording/reproduction apparatus) comprises an optical pickup 101, recording compensation table 102, recording compensation control circuit 103, selector switch 104, test pattern generator 105, (1, 7)RLL modulator 106, low-pass filter 107, A/D converter 108, adaptive equalizer 109, Viterbi decoder 110, demodulator 111, adaptive learning circuit 112, PLL circuit 113, and the like.

The (1, 7)RLL modulator 106 modulates recording data to meet a (1, 7)RLL run length limitation. The test pattern generator 105 generates a test pattern. The test pattern generator 105 pre-stores data in a format used to generate a test pattern to be recorded on the test data sector shown in FIG. 1 or 5, and generates such test pattern upon generation of the test pattern. The selector switch 104 connects to the test pattern generator 105 side when a test pattern is to be recorded, and connects to the modulator 106 side when normal data is to be recorded.

The recording compensation control circuit 103 generates recording pulses at appropriate timings with reference to the recording compensation table 102 in response to the individual run lengths of recording data generated by the test pattern generator 105 or modulator 106. Upon recording a test pattern, since the values of the recording compensation table 102 have not been adjusted yet, recording pulses are generated based on a standard value. The recording pulses generated by the recording compensation control circuit 103 are converted into optical signals by the optical pickup 101, and the optical disk 100 is irradiated with these optical signals. On the optical disk 100, the crystalline state of a recording layer changes in correspondence with the strength of irradiated light. A series of operations in a data recording mode have been explained.

The operations in a data reproduction mode will be explained below. The optical pickup 101 emits a laser beam of an appropriate intensity, which strikes the optical disk 100. In response to this laser beam, light with an intensity corresponding to recorded data recorded on the optical disk 100 is reflected, and is detected by the optical pickup 101, which outputs an electrical signal corresponding to the amount of the reflected light. This electrical signal undergoes appropriate band limitation in the low-pass filter 107.

The output signal from the low-pass filter 107 is converted into a digital signal by the A/D converter 108. The output signal from the A/D converter 108 undergoes waveform equalization in the adaptive equalizer 109 to obtain a response waveform corresponding to a target PR class. The equalization characteristics at that time are adjusted by the adaptive learning circuit 112. The Viterbi decoder 110 checks if the output from the adaptive equalizer 109 is data '1' or '0', and obtains binary data. The obtained binary data undergoes a process (demodulation) opposite to (1, 7)RLL modulation in the demodulator 111, thus obtaining the recorded data. Simultaneously with these operations, the PLL circuit 113 controls sampling clocks in accordance with the output from the adaptive equalizer 109 to set appropriate sampling timings in the A/D converter 108.

Figure 3:
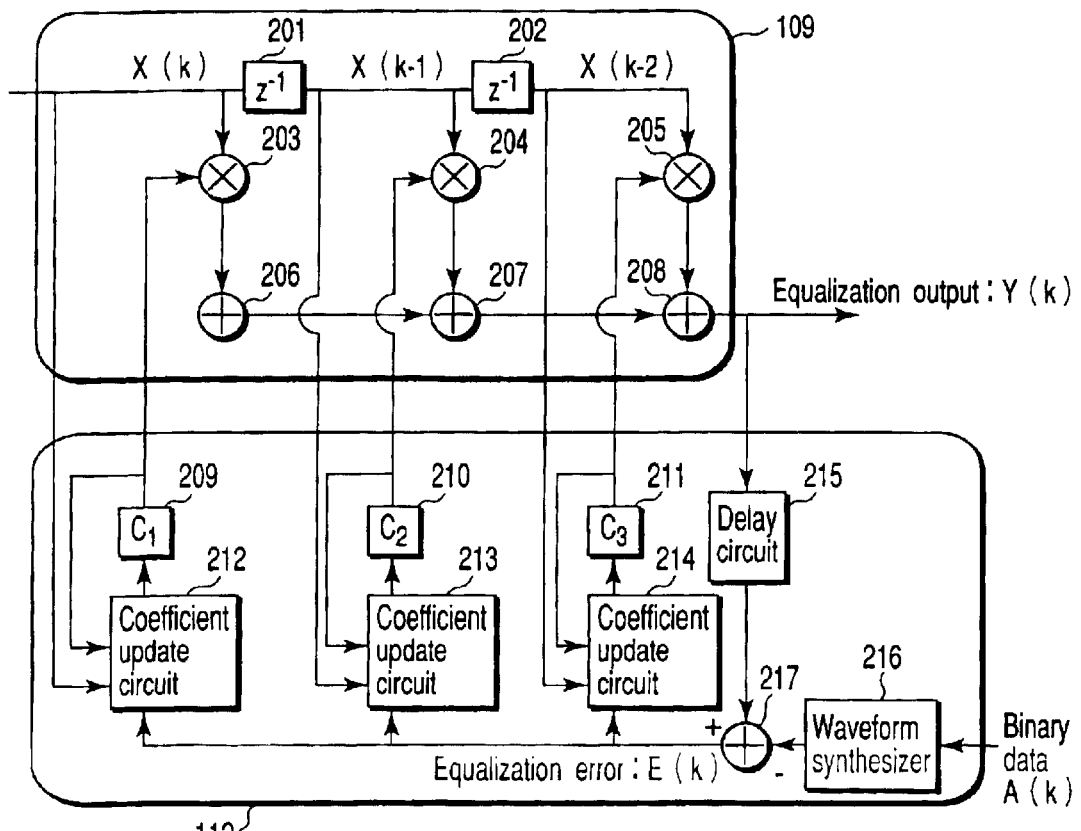
FIG. 3 is a schematic block diagram showing the arrangement of and adaptive equalizer and adaptive learning circuit.

Adaptive learning in the adaptive equalizer 109 and adaptive learning circuit 112 will be described below using FIG. 3. FIG. 3 is a block diagram showing details of the adaptive equalizer 109 and adaptive learning circuit 112. As shown in FIG. 3, the adaptive equalizer 109 comprises delay circuits 201 and 202, multipliers 203, 204, and 205, and adders 206, 207, and 208. The adaptive learning circuit 112 comprises count update circuits 212, 213, and 214, a delay circuit 215, a waveform synthesizer 216, and an adder 217.

Each of the delay circuits 201 and 202 delays an input signal by one clock, and outputs the delayed signal. Each of the multipliers 203, 204, and 205 outputs the product of two input values. Each of the adders 206, 207, and 208 outputs the sum of two input values. FIG. 3 exemplifies a 3-tap digital filter using three multipliers, but the present invention is not limited to such a specific filter. The basic operation remains the same even when the number of multipliers changes. In this embodiment, only the 3-tap filter will be explained.

Let x(k) be the input signal to the adaptive equalizer 109 at time k, and c1, c2, and c3 be multipliers input to the multipliers 203, 204, and 205. Then, output Y(k) of the adaptive equalizer 109 is expressed by:

$$Y(k)=x(k)*c1+x(k-1)*c2+x(k-2)*c3 \quad (1)$$

Let A(k) be binary data which is obtained by the Viterbi decoder 110 that received Y(k). If the target PR class is, e.g., RP(1221), and A(k) is correct reproduction data, original output Z(k) of the adaptive equalizer 109 at time k is given by:

$$Z(k)=A(k)+2*A(k-1)+2*A(k-2)+A(k-3) \quad (2)$$

Hence, equalization error E(k) at time k is defined by:

$$E(k)=Y(k)-Z(k) \quad (3)$$

Adaptive learning updates the coefficients of the multipliers by:

$$c1(k+1)=c1(k)-\alpha*x(k)*E(k) \quad (4)$$

$$c2(k+1)=c2(k)-\alpha*x(k-1)*E(k) \quad (5)$$

$$c3(k+1)=c3(k)-\alpha*x(k-2)*E(k) \quad (6)$$

Note that $\alpha$ in equation (4) is an update coefficient, and sets a positive small value (e.g., 0.01).

The waveform synthesizer 216 executes a process given by equation (2) above. The delay circuit 215 delays output Y(k) of the adder 208 by a time corresponding to the processing time in the Viterbi decoder 110, and the adder 217 executes a process given by equation (3) above. The coefficient update circuit 212 calculates equation (4) to update the coefficient of the multiplier 203. The update result is stored in a register 209. The coefficient update circuit 213 calculates equation (5) to update the coefficient of the multiplier 204. The update result is stored in a register 210. The coefficient update circuit 214 calculates equation (6) to update the coefficient of the multiplier 205. The update result is stored in a register 211. In this way, adaptive learning of the adaptive equalizer 109 is made.

As described above, the test pattern shown in FIG. 1 or 5 is recorded on the test data area, and is then reproduced to make adaptive learning, thereby adjusting the waveform equalization circuit.

In order to assure appropriate adaptive learning, the output result of the Viterbi decoder 110 must be corrected. For this purpose, the sample timings in the A/D converter 108 and the equalization characteristics of the adaptive equalizer 109 must be roughly correct. However, when adaptive learning of the adaptive equalizer 109 is insufficient, some determination errors are produced in the output from the Viterbi decoder 110. The determination errors in the Viterbi decoder 110 are characterized in that the error rate is low when the pattern has a large mark length (large run length), and it is high when the pattern has a small mark length (small run length). Hence, it is desirable to make adaptive learning using a data pattern with a large run length before adaptive learning reaches a certain level.

The relationship between the test pattern shown in FIG. 1 according to the present invention, and the operation of the data reproduction circuit shown in FIG. 2 will be explained below. In the test pattern shown in FIG. 1, the VFO field stores a single-period recorded pattern (3T period). During reproduction of this field, the oscillation frequency and sampling phase of the PLL circuit 113 are adjusted. Upon completion of this adjustment, A/D conversion can be made at a nearly correct frequency and timing. However, since this VFO field stores a single-period data pattern, it does not normally undergo adaptive learning because equalization characteristics specialized to a specific pattern are obtained even after adaptive learning. The first subfield of the test data field stores a pattern whose run length limitation is the (5, 7)RLL rule. Hence, the average recorded mark length is large, and the Viterbi decoder 110 hardly produces determination errors. Therefore, the coefficients of the adaptive equalizer 109 easily converge to those optimized to a recorded pattern with a large mark length (low recording density). The second subfield of the test data field stores a pattern whose run length limitation is the (4, 7)RLL rule. Hence, the average recorded mark length is slightly smaller than that of the first subfield. However, since the coefficients of the adaptive equalizer 109 have already adaptively learned the (5, 7)RLL pattern, the Viterbi decoder 110 hardly produces determination errors. Therefore, the coefficients of the adaptive equalizer 109 easily converge to those optimized to the (4, 7)RLL recorded pattern. Similarly, by adaptively learning data patterns which contain recorded marks that become gradually smaller, the adaptive equalizer 109 gradually learns them. Finally, since the adaptive equalizer 109 adaptively learns the (1, 7)RLL data pattern as the modulation side in the actual data recording mode, final equalization characteristics can be obtained. In a normal data reproduction mode, waveform equalization is done using the adaptive learning result of the test pattern shown in FIG. 1.

Even when the first subfield that should store the (5, 7)RLL rule pattern stores some test patterns with a run length not more than 5 (e.g., a run length=2), an equivalent effect can be obtained. This is because a run length violation pattern that does not influence adaptive learning is permitted, since adaptive equalization of the adaptive equalization circuit shown in FIG. 3 progresses slowly. That is, nearly equivalent effects can be obtained using the run length limited test pattern shown in FIG. 1.

Figure 4:
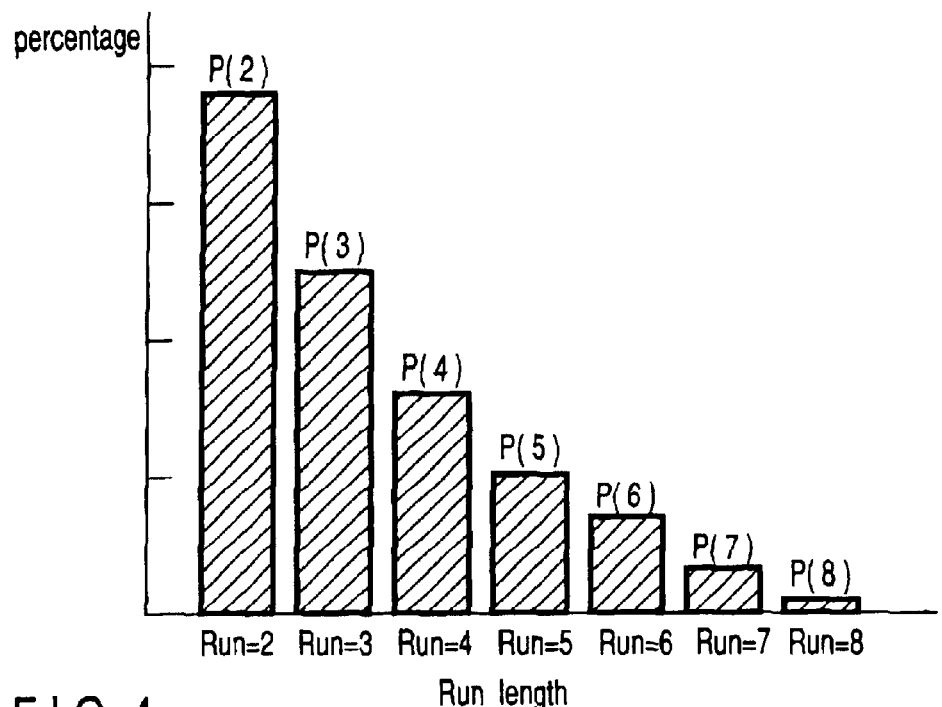
FIG. 4 is a graph showing the frequencies of occurrence of modulated data for respective run lengths obtained by modulating random data by the (1, 7)RLL rule.

A test pattern generated by changing the frequency of occurrence of a minimum run length pattern will be explained below. FIG. 4 shows the frequencies of occurrence of modulated data for respective run lengths when random data is modulated according to the (1, 7)RLL rule. As can be seen from FIG. 4, upon actually recording data, the frequency of occurrence of the smallest run length=2 is highest, and the frequency of occurrence lowers with increasing run length. A characteristic feature of the present invention is to attain easy adjustment to equalization characteristics at a target density by making adaptive learning while gradually decreasing the run length from a test pattern with a large run length, which allows easily adaptive equalization. Hence, the test pattern shown in FIG. 5 can obtain an equivalent effect.

Referring to FIG. 5, an optical disk 100 is a medium on/from which digital data can be recorded/reproduced. The optical disk 100 has concentric or spiral recording tracks, and data is recorded/reproduced along the recording tracks. A part of a recordable area is assured as a test data area 100a in advance. On the recording tracks, data is recorded/reproduced using recorded data units called sectors. As in the first embodiment, each sector is made up of a VFO field, PS field, test data field, and PA field. A plurality of such test data sectors are recorded on the test data area 100a. Also, a normal data recording area undergoes recording/reproduction based on the (1, 7)RLL rule.

Details of the test data sector will be explained below. The VFO field is used to adjust the frequency and phase of a PLL block of the data reproduction circuit. This field stores a recording pattern of a single frequency, e.g., runs of 3T, 3T, i.e., a data pattern ' . . . 000111000111 . . . '. The PS field stores a signal indicating the end of the VFO field, i.e., a data pattern which is not present in the next test data field, e.g., a data pattern '0111 1001 1110 0000 1110 0000 1111 0001 1000'.

The test data field is used for adaptive learning of the reproduction circuit, and adjustment of a recording control table. The test data field includes a plurality of subfields. The first subfield of the test data field stores a test pattern in which the frequency of occurrence of a pattern with a run length=2 is P1(2), that of a pattern with a run length=3 is P1(3), . . . , and that of a pattern with a run length=m is P1(m). The second subfield of the test data field stores a test pattern in which the frequency of occurrence of a pattern with a run length=2 is P2(2), that of a pattern with a run length=3 is P2(3), . . . , and that of a pattern with a run length=m is P2(m). Likewise, the test data field is divided into five subfields, and the frequencies of occurrence of patterns of respective run lengths in these subfields are Pn(m). Note that at least one of $$P1(2) \leq P2(2) \leq P3(2) \leq P4(2) \leq P5(2) \text{ and } P1(2) < P5(2) \quad (7)$$

$$P1(3) \leq P2(3) \leq P3(3) \leq P4(3) \leq P5(3) \text{ and } P1(3) < P5(3) \quad (8)$$

$$P1(4) \leq P2(4) \leq P3(4) \leq P4(4) \leq P5(4) \text{ and } P1(4) < P5(4) \quad (9)$$

$$P1(5) \leq P2(5) \leq P3(5) \leq P4(5) \leq P5(5) \text{ and } P1(5) < P5(5) \quad (10)$$

holds for the frequencies of occurrence of patterns of respective run lengths in these subfields.

In this manner, the frequency of occurrence of a pattern with a small run length is low in the first subfield used to make adaptive learning, and the rate of such a pattern with a small run length is increased as adaptive learning progresses. Using such a test pattern, the same effect as that of the test pattern shown in FIG. 1 can be obtained. When the test pattern shown in FIG. 5 is recorded and reproduced in the same manner as the test pattern shown in FIG. 1, the waveform equalization characteristics of the reproduction circuit can be easily adjusted.

Figure 6:
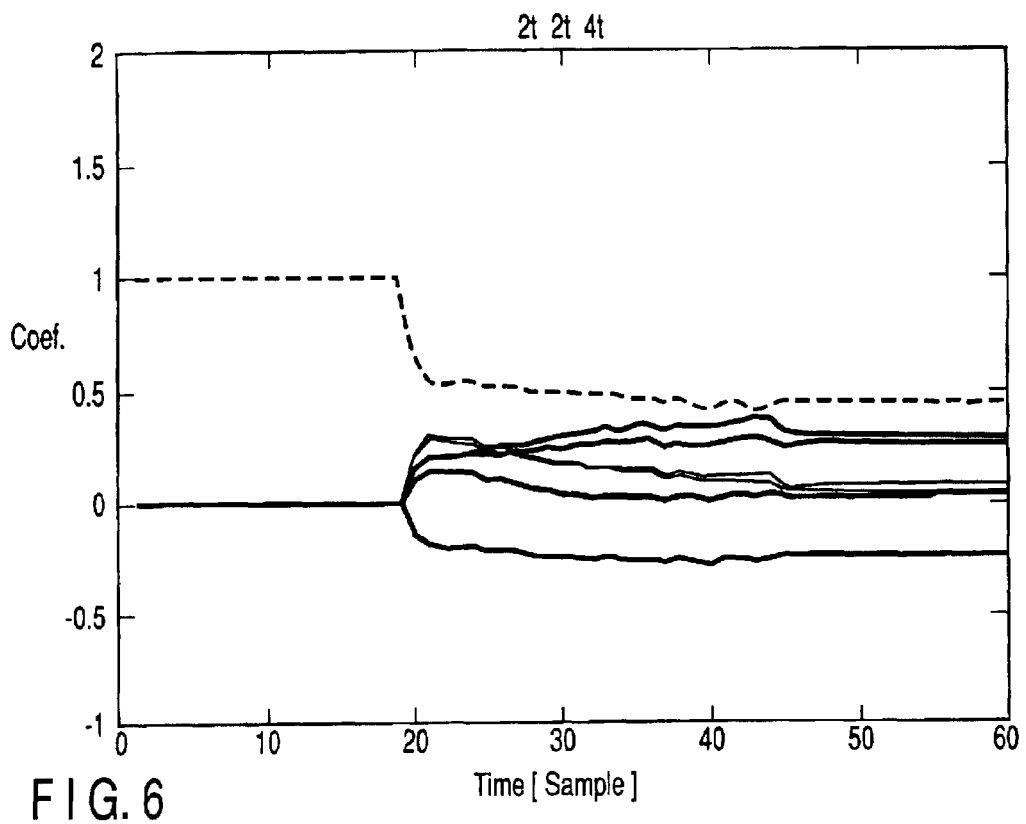
FIG. 6 is a graph showing the learning processes of respective coefficients of the adaptive equalizer when adaptive equalization is done using an arbitrary test pattern different from that shown in FIG. 1 or 5.

FIG. 6 shows the learning processes of respective coefficients of the adaptive equalizer when adaptive equalization is made using an arbitrary test pattern different from that of the present invention. The arbitrary test pattern is a run pattern of 2T, 2T, 4T. That is, a [ . . . 0011000011001111 . . . ] pattern is used. The abscissa of FIG. 6 plots the elapsed time, and the ordinate plots the coefficient value. As can be seen from FIG. 6, adaptive equalization starts near time 20, but the equalization characteristics do not converge to normal characteristics.

Figure 7:
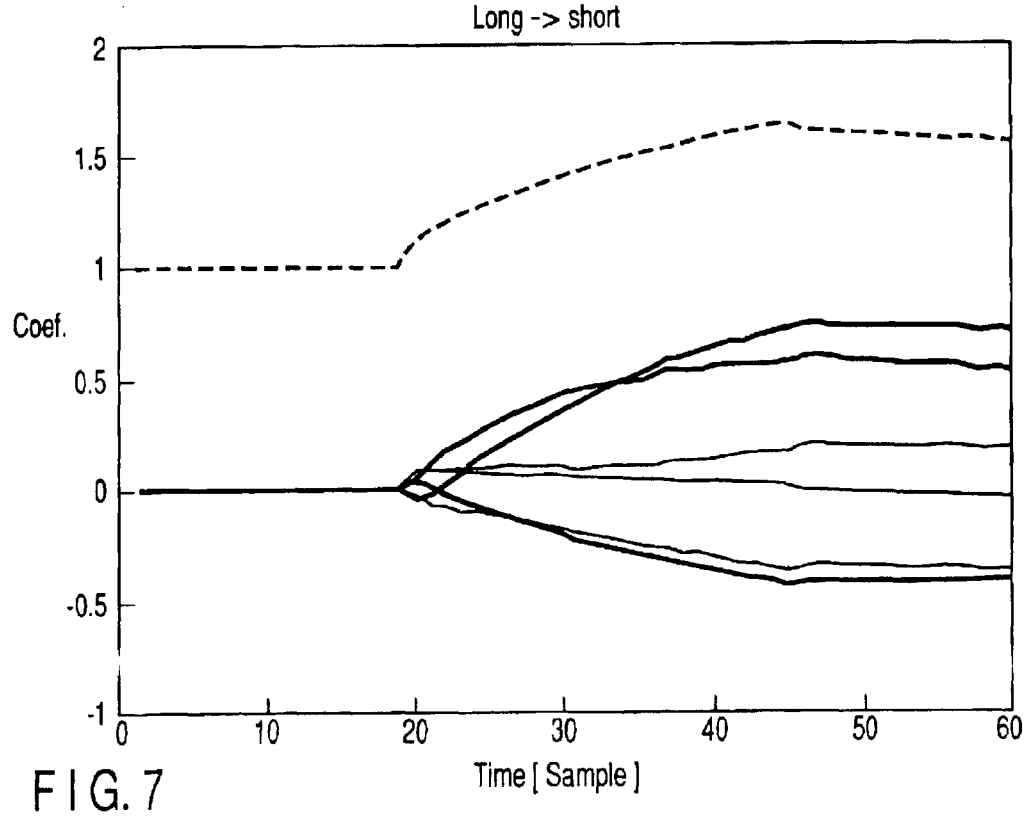
FIG. 7 is a graph showing the learning processes of respective coefficients of the adaptive equalizer when adaptive equalization is done using the test pattern shown in FIG. 1 or 5.

FIG. 7 shows the learning processes when adaptive equalization is made using the test pattern shown in FIG. 1. The abscissa of FIG. 7 plots the elapsed time, and the ordinate plots the coefficient value. As can be seen from FIG. 7, adaptive equalization starts near time 20, and learning then progresses smoothly to obtain target equalization characteristics.

Figure 8:
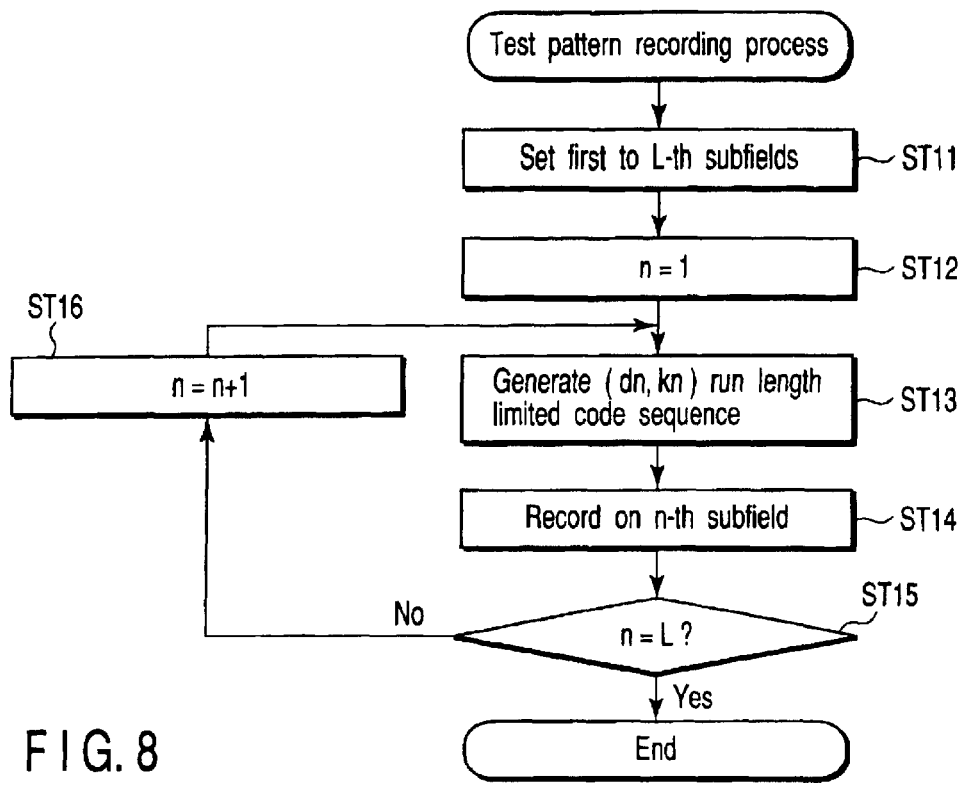
FIG. 8 is a flow chart showing a recording process of the test pattern shown in FIG. 1.
Figure 10:
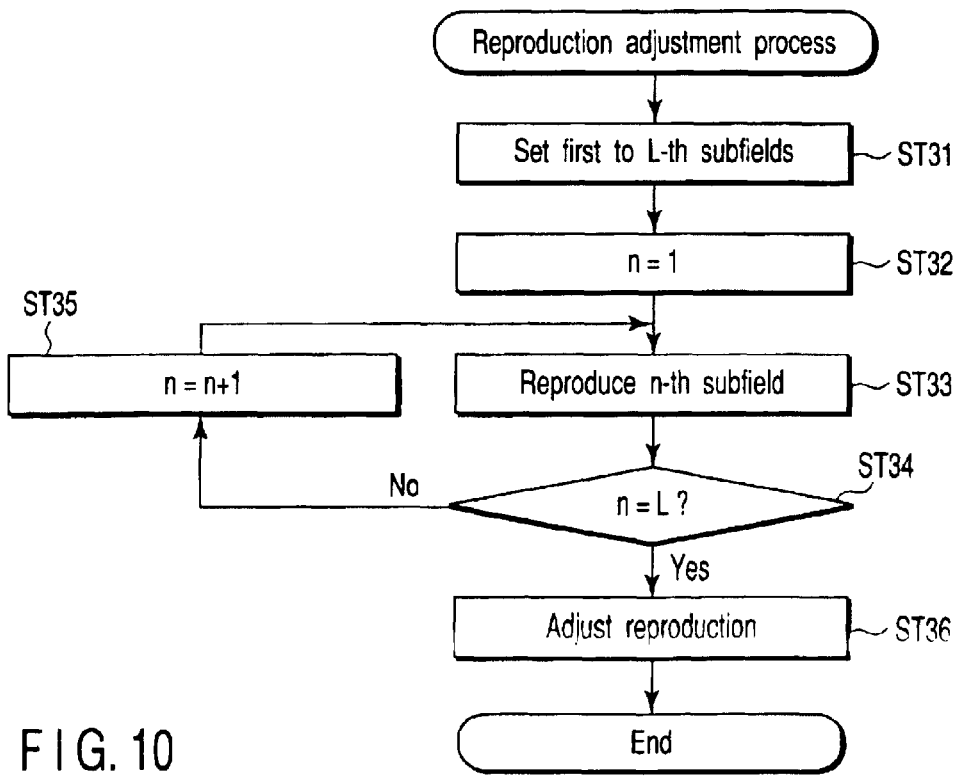
FIG. 10 is a flow chart showing an adjustment process for adjusting a reproduction circuit on the basis of the reproduction result of the test pattern, which is recorded by the recording process shown in FIG. 8 or 9.
Figure 9:
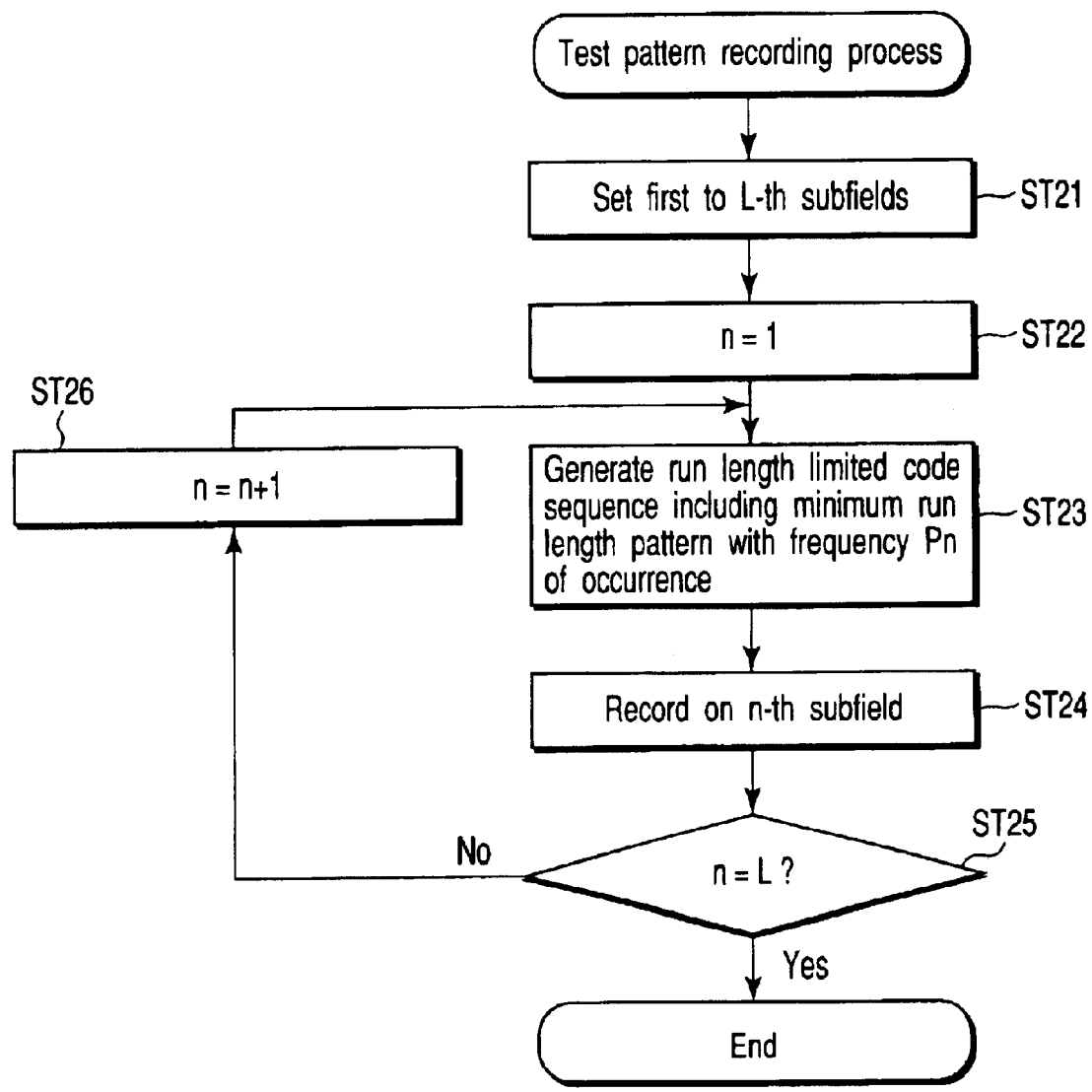
FIG. 9 is a flow chart showing a recording process of the test pattern shown in FIG. 5.

An outline of a test pattern recording process and reproduction adjustment process will be summarized with reference to the flow charts shown in FIGS. 8 to 10. FIG. 8 is a flow chart showing the recording process of the test pattern shown in FIG. 1. FIG. 9 is a flow chart showing the recording process of the test pattern shown in FIG. 5. FIG. 10 is a flow chart showing the adjustment process for adjusting the reproduction circuit on the basis of the reproduction result of the test pattern recorded by the recording process shown in FIG. 8 or 9. The test pattern recording process is executed by the recording/reproduction apparatus shown in FIG. 2. Also, the reproduction circuit adjustment process is executed by the recording/reproduction apparatus shown in FIG. 2.

The recording process of the test pattern shown in FIG. 1 will be described first with reference to FIG. 8. As shown in FIG. 8, the first to L-th subfields are set in the test data area 100*a* (ST11), and n=1 is set (ST12). The test pattern generator 105 generates a (d1, k1) run length limited code sequence (ST13). The optical pickup 101 records the (d1, k1) run length limited code sequence on the first subfield in the test data area 100*a* (ST14). The (d1, k1) run length limited code sequence is, e.g., a (5, 7) run length limited code sequence. At this time, since n=1 (i.e., n≠L (ST15, NO)), the value n is incremented (ST16).

That is, n=2 is set, and the test pattern generator 105 generates a (d2, k2) run length limited code sequence (ST13). The optical pickup 101 records the (d2, k2) run length limited code sequence on the second subfield in the test data area 100*a* (ST14). The (d2, k2) run length limited code sequence is, e.g., a (4, 7) run length limited code sequence. At this time, since n=2 (i.e., n≠L (ST15, NO)), the value n is incremented (ST16).

That is, n=3 is set, and the test pattern generator 105 generates a (d3, k3) run length limited code sequence (ST13). The optical pickup 101 records the (d3, k3) run length limited code sequence on the third subfield in the test data area 100*a* (ST14). The (d3, k3) run length limited code sequence is, e.g., a (3, 7) run length limited code sequence. At this time, since n=3 (i.e., n≠L (ST15, NO)), the value n is incremented (ST16).

That is, n=4 is set, and the test pattern generator 105 generates a (d4, k4) run length limited code sequence (ST13). The optical pickup 101 records the (d4, k4) run length limited code sequence on the fourth subfield in the test data area 100*a* (ST14). The (d4, k4) run length limited code sequence is, e.g., a (2, 7) run length limited code sequence. At this time, since n=4 (i.e., n≠L (ST15, NO)), the value n is incremented (ST16).

That is, n=5 is set, and the test pattern generator 105 generates a (d5, k5) run length limited code sequence (ST13). The optical pickup 101 records the (d5, k5) run length limited code sequence on the fifth subfield in the test data area 100*a* (ST14). The (d5, k5) run length limited code sequence is, e.g., a (1, 7) run length limited code sequence. At this time, n=5. If L=5, since n=L at that time (ST15, YES), the test pattern recording process ends.

With the aforementioned test pattern recording process, the test pattern shown in FIG. 1 is recorded.

Next, the recording process of the test pattern shown in FIG. 5 will be described first with reference to FIG. 9. As shown in FIG. 9, the first to L-th subfields are set in the test data area 100*a* (ST21), and n=1 is set (ST22). The test pattern generator 105 generates a run length limited code sequence that includes a minimum run length pattern with the frequency P1 of occurrence (ST23). The optical pickup 101 records the run length limited code sequence that includes the minimum run length pattern with the frequency P1 of occurrence on the first subfield in the test data area 100*a* (ST24). At this time, since n=1 (i.e., n≠L (ST25, NO)), the value n is incremented (ST26).

That is, n=2 is set, and the test pattern generator 105 generates a run length limited code sequence that includes a minimum run length pattern with the frequency P2 of occurrence (ST23). The optical pickup 101 records the run length limited code sequence that includes the minimum run length pattern with the frequency P2 of occurrence on the second subfield in the test data area 100*a* (ST24). At this time, since n=2 (i.e., n≠L (ST25, NO)), the value n is incremented (ST26).

That is, n=3 is set, and the test pattern generator 105 generates a run length limited code sequence that includes a minimum run length pattern with the frequency P3 of occurrence (ST23). The optical pickup 101 records the run length limited code sequence that includes the minimum run length pattern with the frequency P3 of occurrence on the third subfield in the test data area 100*a* (ST24). At this time, since n=3 (i.e., n≠L (ST25, NO)), the value n is incremented (ST26).

That is, n=4 is set, and the test pattern generator 105 generates a run length limited code sequence that includes a minimum run length pattern with the frequency P4 of occurrence (ST23). The optical pickup 101 records the run length limited code sequence that includes the minimum run length pattern with the frequency P4 of occurrence on the fourth subfield in the test data area 100*a* (ST24). At this time, since n=4 (i.e., n≠L (ST25, NO)), the value n is incremented (ST26).

That is, n=5 is set, and the test pattern generator 105 generates a run length limited code sequence that includes a minimum run length pattern with the frequency P5 of occurrence (ST23). The optical pickup 101 records the run length limited code sequence that includes the minimum run length pattern with the frequency P5 of occurrence on the fifth subfield in the test data area 100*a* (ST24). At this time, n=5. If L=5, since n=L at that time (ST25, YES), the test pattern recording process ends.

With the aforementioned test pattern recording process, the test pattern shown in FIG. 5 is recorded.

The adjustment process for adjusting the reproduction circuit on the basis of the reproduction result of the test pattern recorded by the recording process shown in FIG. 8 or 9 will be explained below with reference to FIG. 10. As shown in FIG. 10, the first to L-th subfields are set in the test data area 100a (ST31), n=1 is set (ST32), and the optical pickup 101 reproduces the first subfield (ST33). That is, the (5, 7) run length limited code sequence recorded by the recording process shown in FIG. 8 is reproduced. Or the run length limited code sequence that includes the minimum run length pattern with the frequency P1 of occurrence recorded by the recording process shown in FIG. 9 is reproduced. At this time, since n=1 (i.e., n≠L (ST34, NO)), the value n is incremented (ST35).

That is, n=2 is set, and the optical pickup 101 reproduces the second subfield (ST33). That is, the (4, 7) run length limited code sequence recorded by the recording process shown in FIG. 8 is reproduced. Or the run length limited code sequence that includes the minimum run length pattern with the frequency P2 of occurrence recorded by the recording process shown in FIG. 9 is reproduced. At this time, since n=2 (i.e., n≠L (ST34, NO)), the value n is incremented (ST35).

That is, n=3 is set, and the optical pickup 101 reproduces the third subfield (ST33). That is, the (3, 7) run length limited code sequence recorded by the recording process shown in FIG. 8 is reproduced. Or the run length limited code sequence that includes the minimum run length pattern with the frequency P3 of occurrence recorded by the recording process shown in FIG. 9 is reproduced. At this time, since n=3 (i.e., n≠L (ST34, NO)), the value n is incremented (ST35).

That is, n=4 is set, and the optical pickup 101 reproduces the fourth subfield (ST33). That is, the (2, 7) run length limited code sequence recorded by the recording process shown in FIG. 8 is reproduced. Or the run length limited code sequence that includes the minimum run length pattern with the frequency P4 of occurrence recorded by the recording process shown in FIG. 9 is reproduced. At this time, since n=4 (i.e., n≠L (ST34, NO)), the value n is incremented (ST35).

That is, n=5 is set, and the optical pickup 101 reproduces the fifth subfield (ST33). That is, the (1, 7) run length limited code sequence recorded by the recording process shown in FIG. 8 is reproduced. Or the run length limited code sequence that includes the minimum run length pattern with the frequency P5 of occurrence recorded by the recording process shown in FIG. 9 is reproduced. At this time, n=5. If L=5, since n=L at that time (ST34, YES), the test pattern reproduction process ends.

Subsequently, the reproduction performance is adjusted based on the reproduction result (ST36). That is, the adaptive learning circuit 112 adjusts the equalization characteristics of the adaptive equalizer 109.

As described above, since a test data recording pattern according to the present invention is recorded on a predetermined test data area, and adaptive equalization is made while reproducing the recorded data, adjustment of recording control data and adjustment of the reproduction circuit can be stably attained even in a high-density recording mode. This technique can be similarly used not only in an optical disk that exploits a phase change of the recording film but also in a magnetooptical disk apparatus or magnetic disk apparatus. Also, the test pattern of the present invention allows easy adjustment even in adjustment of a recording waveform since recording fields are defined in correspondence with run lengths.

The effect of the present invention will be described below. According to the present invention, even when optimal equalization characteristics are not obtained, clocks can be reproduced with high precision, and optimal equalization characteristics are obtained by making adaptive learning using these clocks. For this purpose, the test data field is divided into a plurality of M successive subfields. The divided first subfield records a test pattern of a (d1, k1) run length limited code. The divided second subfield records a test pattern of a (d2, k2) run length limited code. Likewise, the L-th (last) subfield records a test pattern of a (dL, kL) run length limited code. d1>d2>. . . >dL holds for d1, d2, . . . , DL. Furthermore, the test pattern of the (dL, kL) run length limited code recorded on the last subfield is the same as the run length limited code rule used in actual recording/reproduction.

The run length limited code shown in FIG. 1 or 5 is recorded/reproduced on/from the test data area, and adaptive learning of the data reproduction circuit is made using this reproduction signal. Hence, adaptive learning can progress without divergence.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A run length limited code generation method, comprising:

generating a plurality of different code sequences, which have recording densities that gradually become higher, and which are to be recorded on a plurality of successive subfields on a test data field of an information storage medium; and generating the plurality of different code sequences on the basis of a plurality of different run length limitations which gradually decrease a minimum run length of identical codes.

2. A run length limited code generation method, comprising:

generating a plurality of different code sequences, which have recording densities that gradually become higher, and which are to be recorded on a plurality of successive subfields on a test data field of an information storage medium, including generating a (d, k) run length limited code sequence which meets a condition that a minimum run length of identical codes is (d+1), and a maximum run length of identical codes is (k+1);

generating a (d1, k1) run length limited code sequence to be recorded on a first subfield of the information storage medium;

generating a (d2, k2) run length limited code sequence to be recorded on a second subfield of the information storage medium; and generating a (dL, kL) run length limited code sequence to be recorded on an L-th subfield of the information storage medium;

wherein d1>d2> . . . >dL.

3. A run length limited code generation method, comprising:

generating a plurality of different code sequences, which have recording densities that gradually become higher, and which are to be recorded on a plurality of successive subfields on a test data field of an information storage medium; and under the condition P1≦P2≦ . . . ≦PL and P1<PL, generating a run length limited code sequence that includes a minimum run length pattern with an occurrence frequency P1, a run length limited code sequence that includes a minimum run length pattern with an occurrence frequency P2, and a run length limited code sequence that includes a minimum run length pattern with an occurrence frequency PL.

4. A run length limited code recording/reproduction apparatus for generating, recording, and reproducing a run length limited code sequence, comprising:

a generation unit for generating a plurality of different code sequences which have recording densities that gradually become higher; and a recording unit for recording the plurality of different code sequences generated by the generation unit on a plurality of successive subfields in a test data field of an information storage medium;

wherein the generation unit generates the plurality of different code sequences on the basis of a plurality of different run length limitations which gradually decrease a minimum run length of identical codes.

5. An apparatus according to claim 4, further comprising:

a reproduction unit for reproducing the plurality of subfields in turn; and an adjustment unit for adjusting reproduction performance of the reproduction unit on the basis of reproduction results of the plurality of subfields.

6. A run length limited code recording/reproduction apparatus for generating, recording, and reproducing a run length limited code sequence, comprising:

a generation unit for generating a plurality of different code sequences which have recording densities that gradually become higher; and a recording unit for recording the plurality of different code sequences generated by the generation unit on a plurality of successive subfields in a test data field of an information storage medium;

wherein a (d, k) run length limited code sequence meets a condition that a minimum run length of identical codes is (d+1), and a maximum run length of identical codes is (k+1), and wherein, under the condition d1>d2> . . . >dL, the generation unit generates a (d1, k1) run length limited code sequence, a (d2, k2) run length limited code sequence, and a (dL, kL) run length limited code sequence, and the recording unit records the (d1, k1) run length limited code sequence on a first subfield of the information storage medium, the (d2, k2) run length limited code sequence on a second subfield of the information storage medium, and the (dL, kL) run length limited code sequence on an L-th subfield of the information storage medium.

7. A run length limited code recording/reproduction apparatus for generating, recording, and reproducing a run length limited code sequence, comprising:

a generation unit for generating a plurality of different code sequences which have recording densities that gradually become higher; and a recording unit for recording the plurality of different code sequences generated by the generation unit on a plurality of successive subfields in a test data field of an information storage medium;

wherein, under the condition P1≦P2≦ . . . ≦PL and P1<PL, the generation unit generates a first run length limited code sequence that includes a minimum run length pattern with an occurrence frequency P1, a second run length limited code sequence that includes a minimum run length pattern with an occurrence frequency P2, and a third run length limited code sequence that includes a minimum run length pattern with an occurrence frequency PL, and the recording unit records the first, second, and third run length limited code sequences in turn on a plurality of successive subfields in a test data field of an information storage medium.

8. An apparatus according to claim 7, further comprising:

a reproduction unit for reproducing the plurality of subfields in turn; and an adjustment unit for adjusting reproduction performance of the reproduction unit on the basis of reproduction results of the plurality of subfields.

9. A run length limited code recording/reproduction method for generating, recording, and reproducing a run length limited code sequence, comprising:

generating a plurality of different code sequences, which have recording densities that gradually become higher, on the basis of a plurality of different run length limitations which gradually decrease a minimum run length of identical codes; and recording the plurality of generated different code sequences on a plurality of successive subfields in a test data field of an information storage medium.

10. A method according to claim 9, further comprising:

reproducing the plurality of subfields; and adjusting reproduction performance on the basis of reproduction results of the plurality of subfields.

11. A run length limited code recording/reproduction method for generating, recording, and reproducing a run length limited code sequence, comprising:

generating a plurality of different code sequences which have recording densities that gradually become higher; and recording the plurality of generated different code sequences on a plurality of successive subfields in a test data field of an information storage medium;

wherein a (d, k) run length limited code sequence which meets a condition that a minimum run length of identical codes is (d+1) and a maximum run length of identical codes is (k+1);

generating a (dl, kl) run length limited code sequence, a (d2, k2) run length limited code sequence, and a (dL, kL) run length limited code sequence; and recording the (dl, kl) run length limited code sequence on a first subfield of the information storage medium, the (d2, k2) run length limited code sequence on a second subfield of the information storage medium, and the (dL, kL) run length limited code sequence on an L-th subfield of the information storage medium;

wherein d1>d2> . . . >dL.

12. A run length limited code recording/reproduction method for generating, recording, and reproducing a run length limited code sequence, comprising:

generating a plurality of different code sequences which have recording densities that gradually become higher; and recording the plurality of generated different code sequences on a plurality of successive subfields in a test data field of an information storage medium;

generating a run length limited code sequence that includes a minimum run length pattern with a an occurrence frequency P1, a run length limited code sequence that includes a minimum run length pattern with an occurrence frequency P2, and a run length limited code sequence that includes a minimum run length pattern with an occurrence frequency PL; and recording the first, second, and third run length limited code sequences in turn on a plurality of successive subfields in a test data field of an information storage medium;

wherein $PL \leqq P2 \leqq \ldots \leqq PL$ and $P1<PL$.

13. A method according to claim 12, further comprising:

reproducing the plurality of subfields; and adjusting reproduction performance on the basis of reproduction results of the plurality of subfields.

* * * * *